United States Patent [19]

Crafts

[11] Patent Number: 5,541,548
[45] Date of Patent: Jul. 30, 1996

[54] ANALOG OUTPUT DRIVER FOR GATE ARRAYS

[75] Inventor: Harold S. Crafts, Colorado Springs, Colo.

[73] Assignees: AT&T Global Information Solutions Company, Dayton, Ohio; Hyundai Electronics America, Milpitas, Calif.; Symbios Logic Inc., Fort Collins, Colo.

[21] Appl. No.: 484,197

[22] Filed: Jun. 7, 1995

Related U.S. Application Data

[63] Continuation of Ser. No. 173,909, Dec. 27, 1993, abandoned.

[51] Int. Cl.[6] ............................ H01L 27/02; H01L 27/10
[52] U.S. Cl. ..................... 327/364; 327/561; 327/565; 327/566; 327/553; 257/202; 257/204
[58] Field of Search ................................ 307/270, 443, 307/475, 571, 573, 296.8; 257/202, 203, 204, 205, 206, 200

[56] References Cited

U.S. PATENT DOCUMENTS

| | | | |
|---|---|---|---|
| 4,641,108 | 2/1987 | Gill, Jr. | 257/205 |
| 4,745,305 | 5/1988 | Crafts | 302/425 |
| 4,975,758 | 12/1990 | Crafts | 257/202 |
| 5,119,158 | 6/1992 | Hatano | 257/203 |
| 5,237,215 | 8/1993 | Nakata | 257/205 |
| 5,298,806 | 3/1994 | Sako | 327/553 |
| 5,338,977 | 8/1994 | Carobolante | 307/521 |

*Primary Examiner*—Timothy P. Callahan
*Assistant Examiner*—Dinh T. Le
*Attorney, Agent, or Firm*—Wayne P. Bailey; Douglas S. Foote

[57] ABSTRACT

The invention concerns an analog amplifier constructed using digital transistors. The digital transistors are those contained in a gate array, and which are used for fabrication of digital devices. The analog amplifier includes an invertor, which contains two cascode amplifiers in series. The analog amplifier also includes a differential amplifier. The invertor is contained within the feedback circuit of the differential amplifier.

8 Claims, 15 Drawing Sheets

ANALOG OUTPUT DRIVER FOR GATE ARRAYS

This is a continuation of application Ser. No. 08/173,909 filed Dec. 27, 1993 and now abandoned.

The invention concerns output amplifiers for gate arrays. Typically, gate arrays handle digital signals. The invention constructs, from such gate arrays, an output driver capable of handling analog signals.

BACKGROUND OF THE INVENTION

Different integrated circuits (ICs), which perform different functions, are, in many cases, constructed from individual transistors which are themselves quite similar. Gate array technology takes advantage of this similarity, by using identical, prefabricated arrays of transistors as the starting point for fabrication of the ICs.

For example, a manufacturer of ICs will stockpile, in advance, multiple copies of several different types of transistor arrays. Then, when the manufacturer receives an order for a particular IC, the manufacturer will select the best array, and complete the fabrication steps for the IC, using the selected array.

This approach reduces the processing time between the receipt of the order and the shipping of the completed IC, because many of the basic fabrication steps have been completed in advance.

Typical gate arrays are constructed of digital, as opposed to analog, transistors. The two types perform different functions. The digital type acts as a switch: it is either ON or OFF. The analog type acts as an amplifier: it amplifies a signal.

These two types are constructed differently: Analog transistors should have long channels with large surface area: their channels should be long and wide.

The channel must be long, in order to obtain high gain. [See, for example, S. M. Sze, *Physics of Semiconductor Devices,* (1969, John Wiley, ISBN 471 84290 7) chapter 7, section 3, p. 340 et seq].

The channel must be wide, in order to reduce a particular type of electrical noise, namely, "1/f noise." This type of noise is so-called because it has been experimentally found to be nearly inversely proportional to frequency, as the designation "1/f" indicates. Because of the inverse proportionality, much of the noise power is concentrated at low frequencies. If gain at low frequencies is important, then the "1/f noise" presents a problem. 1/f noise is reduced by increasing surface area of the channel.

Digital transistors should have channels as short as possible. However, since a short channel produces a large electric field along the channel's length (i.e., between the source and the drain), the channel should be sufficiently long that the electric field does not exceed the breakdown value of the channel material.

Exemplary Transistor Dimensions

Channel dimensions L (length) and W (width) are defined in FIG. 1A. In a common digital transistor, the channel length lies between 0.7 and 1.5 microns (a micron equals $10^{-6}$ meter), and the channel width lies between 10 and 50 microns. (These values can be scaled by proper scaling factors to obtain channels of different sizes.)

In contrast, for an analog transistor, the channel length commonly lies between 16 and 25 microns, and the channel width commonly lies between 40 to 400 microns. Thus, based on these examples, in an analog transistor, the channel length is about 10 to 35 times longer, and the channel width ranges from equal to about 40 times wider, than the comparable dimensions in a digital transistor.

OBJECTS OF THE INVENTION

An object of the invention is to provide an analog driver, located on an integrated circuit, and constructed of digital transistors.

SUMMARY OF THE INVENTION

In one form of the invention, an analog amplifier is constructed from transistors which comprise a gate array. These transistors are of the digital type.

DETAILED DESCRIPTION OF THE INVENTION

A brief explanation of the cascode amplifier will be given, using bipolar junction transistors (BJTs), for simplicity.

Common Emitter Amplifier

Figure 1A:
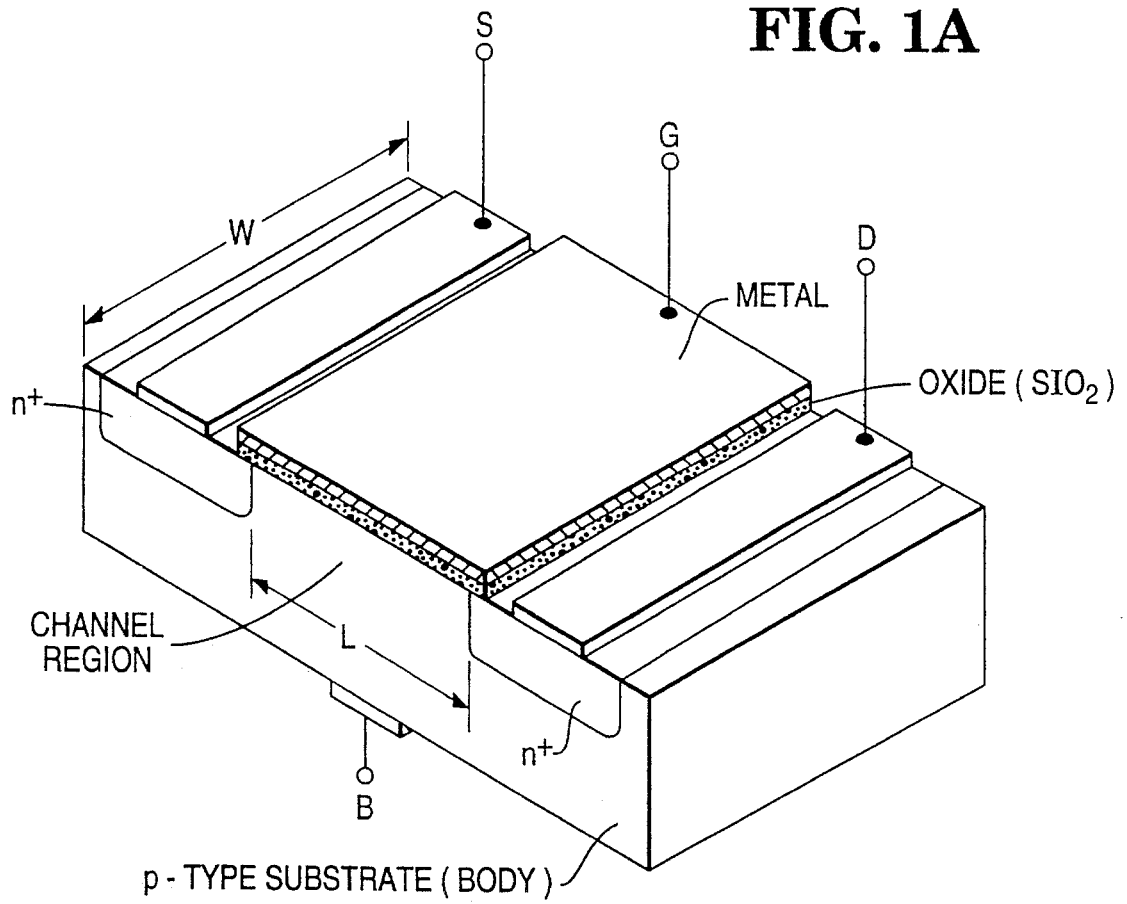
FIG. 1A illustrates channel dimensions in a field-effect transistor.
Figure 1:
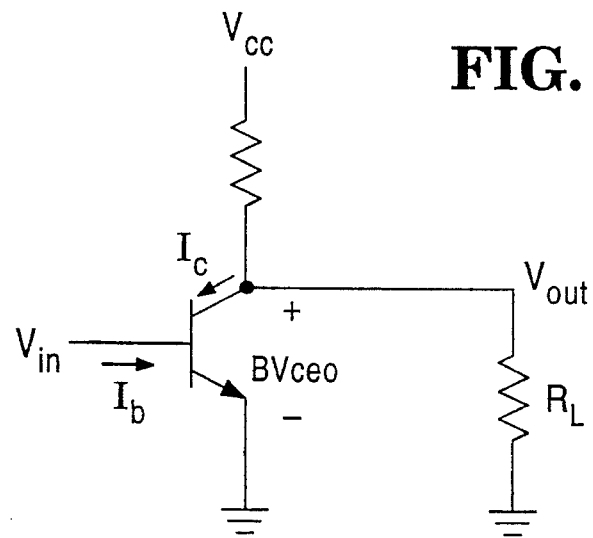
FIG. 1 illustrates a common-emitter amplifier.

FIG. 1 illustrates a common emitter (CE) amplifier. Its major characteristics are the following:

A lower breakdown voltage at the output, BVceo, than in the common base amplifier, discussed below. (In the CE amplifier, the output breakdown voltage is measured between the emitter and the collector, hence the designation "ceo" in BVceo.)

There is both current gain (Ic is greater than Ib) and voltage gain (Vout is a multiple of Vin).

Figure 2:
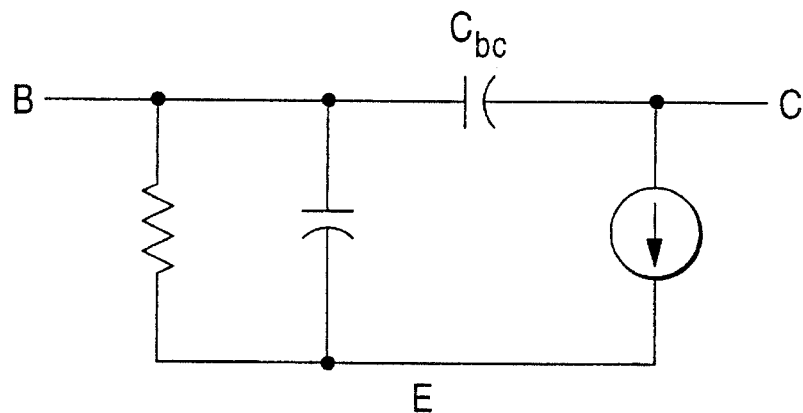
FIG. 2 is one type of equivalent circuit for a bipolar junction transistor.
Figure 3:
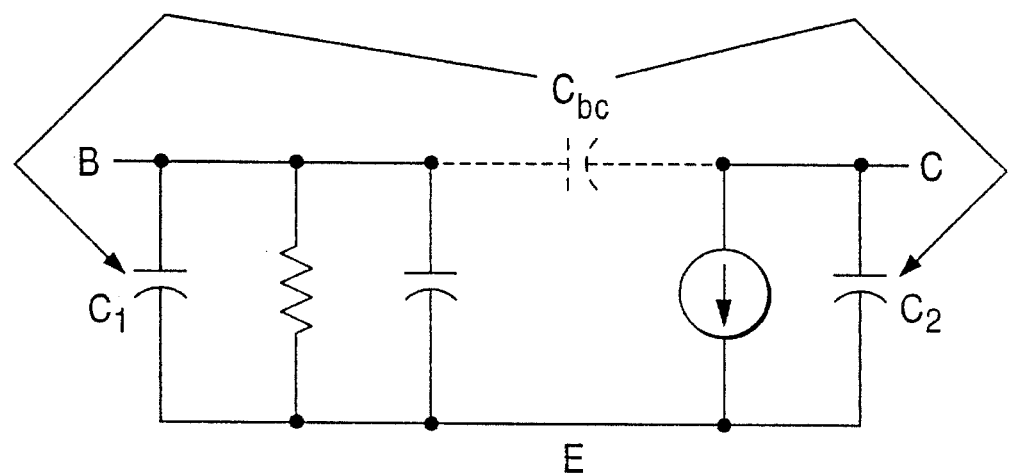
FIG. 3 illustrates how the Miller Effect can substitute C1 and C2 for Cbc.

The base-to-collector capacitance, Cbc, shown in the equivalent circuit of FIG. 2, causes a high input capacitance, because of the Miller Effect. The Miller Effect states that Cbc (shown in phantom in FIG. 3) can be replaced by the pair of capacitors C1 and C2. C1 is much larger than Cbc.

The large input capacitance C1 causes a breakpoint at a low frequency, thereby limiting the high-frequency performance of the CE amplifier.

There is a high input impedance, Rin, seen by Vin.

Common Base Amplifier

Figure 4:
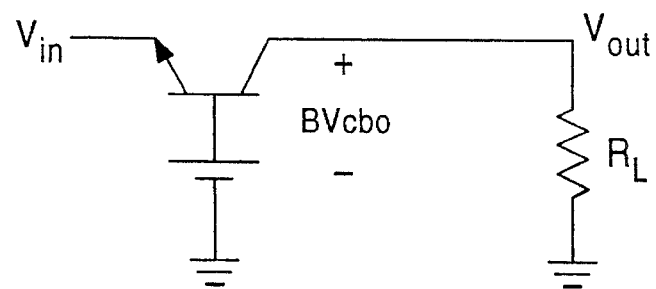
FIG. 4 illustrates a common-base amplifier.

FIG. 4 illustrates a common base (CB) amplifier. Its major characteristics are the following:

A higher output breakdown voltage, BVcbo. The breakdown voltage is higher than in the common emitter case, because, in FIG. 4, the voltage is applied across a single reverse-biased PN junction. (In FIG. 1, the CE case, the breakdown voltage is applied across the base region of the transistor, which is thin. Under high voltage, the depletion region of the BC junction can extend across the base region, and contact the BE junction, causing breakdown. Thus, in the CE case, even though the breakdown voltage is applied across two junctions, the thinness of the base region reduces the effective breakdown voltage.)

Figure 5:
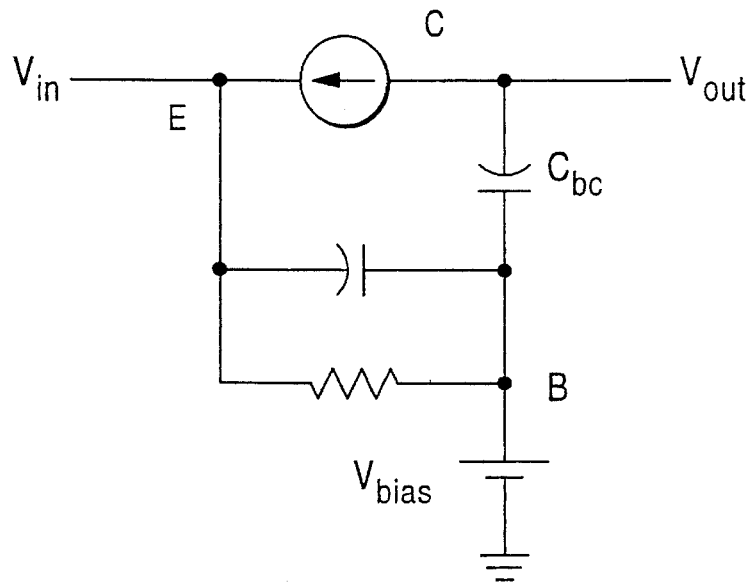
FIG. 5 is one type of equivalent circuit for the bipolar transistor of FIG. 4.

Better high frequency performance, because Cbc does not connect the output to the input, as FIG. 5 illustrates.

No significant current gain (Ic approximately equals Ib), but voltage gain is attained.

A low input impedance, Rin, is obtained.

Cascode Amplifier

Figure 6:
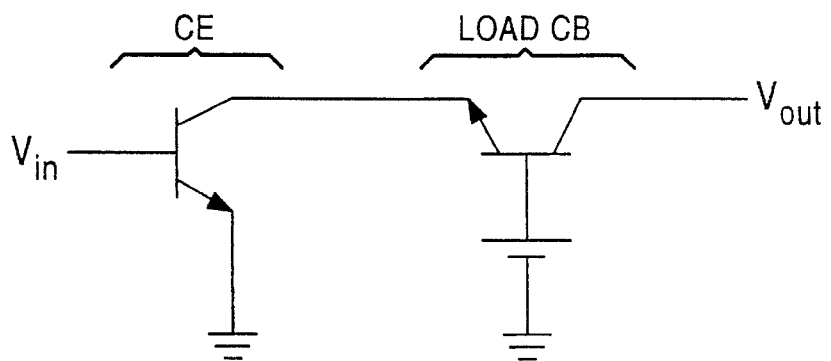
FIG. 6 illustrates a cascode amplifier.

FIG. 6 illustrates a basic cascode amplifier. It is a combination of a common-emitter input stage, with a common-base load, as indicated. Its major characteristics are the following:

A breakdown voltage, at the output, which is higher than that in either the CE or CB stage. In the cascode amplifier, the voltage at the output is applied across two transistors in series; each transistor bears only part of the voltage.

The same high input impedance, Rin, is obtained as in the CE amplifier.

A very high output impedance, Rout, is obtained.

Good high-frequency performance, because of the CB output stage.

A higher net voltage gain than either the CE or CB.

MOSFETs Can be Substituted

Metal Oxide Semiconductor Field-Effect Transistors (MOSFETs) can be substituted for the BJTs in the cascode amplifier of FIG. 6. A common-gate MOSFET amplifier, shown in FIG. 7, is analogous to the CB amplifier of FIG. 4; a common-source MOSFET amplifier, shown in FIG. 8, is analogous to the CE amplifier shown in FIG. 1.

Figure 7:
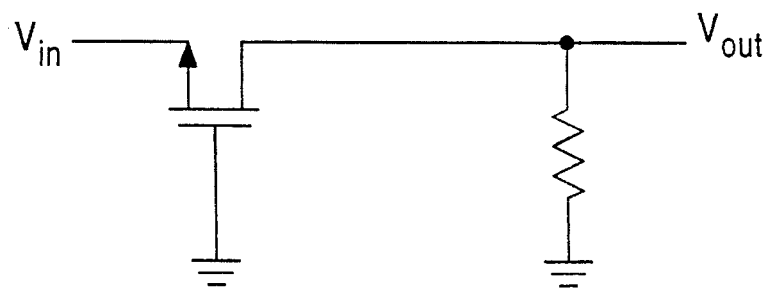
FIG. 7 illustrates a common gate amplifier.
Figure 8:
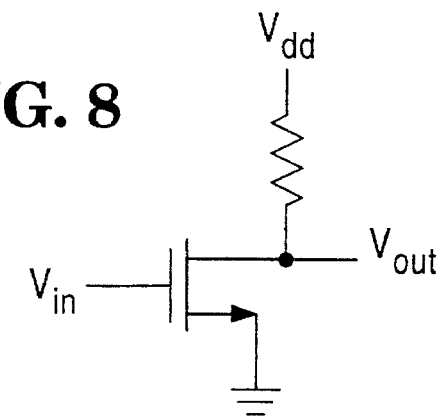
FIG. 8 illustrates a common source amplifier.
Figure 9:
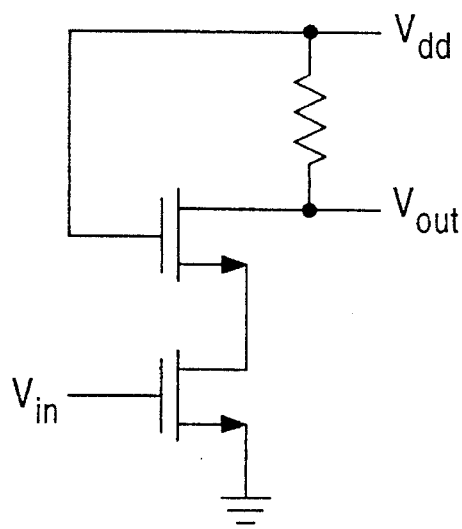
FIG. 9 illustrates a cascode amplifier using the common gate and common source amplifier of FIGS. 7 and 8.
Figure 10:
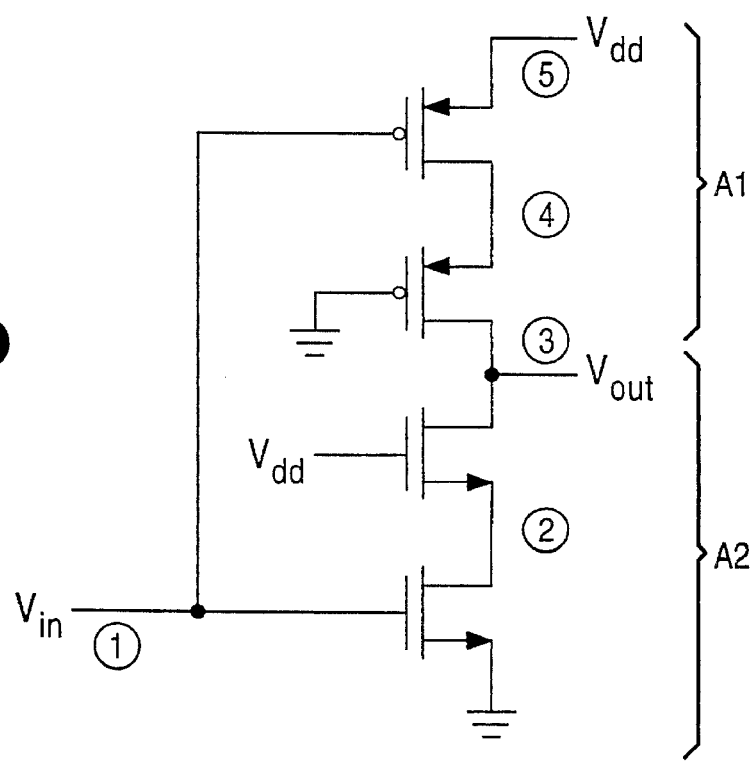
FIG. 10 illustrates a cascode invertor.

FIG. 9 illustrates the two amplifiers of FIGS. 7 and 8, connected into a cascode amplifier. FIG. 10 illustrates two cascode amplifiers A1 and A2 connected in series. (Amplifier A1 is constructed of p-channel MOSFETs, and A2 is constructed of n-channel MOSFETs.)

Figure 11:
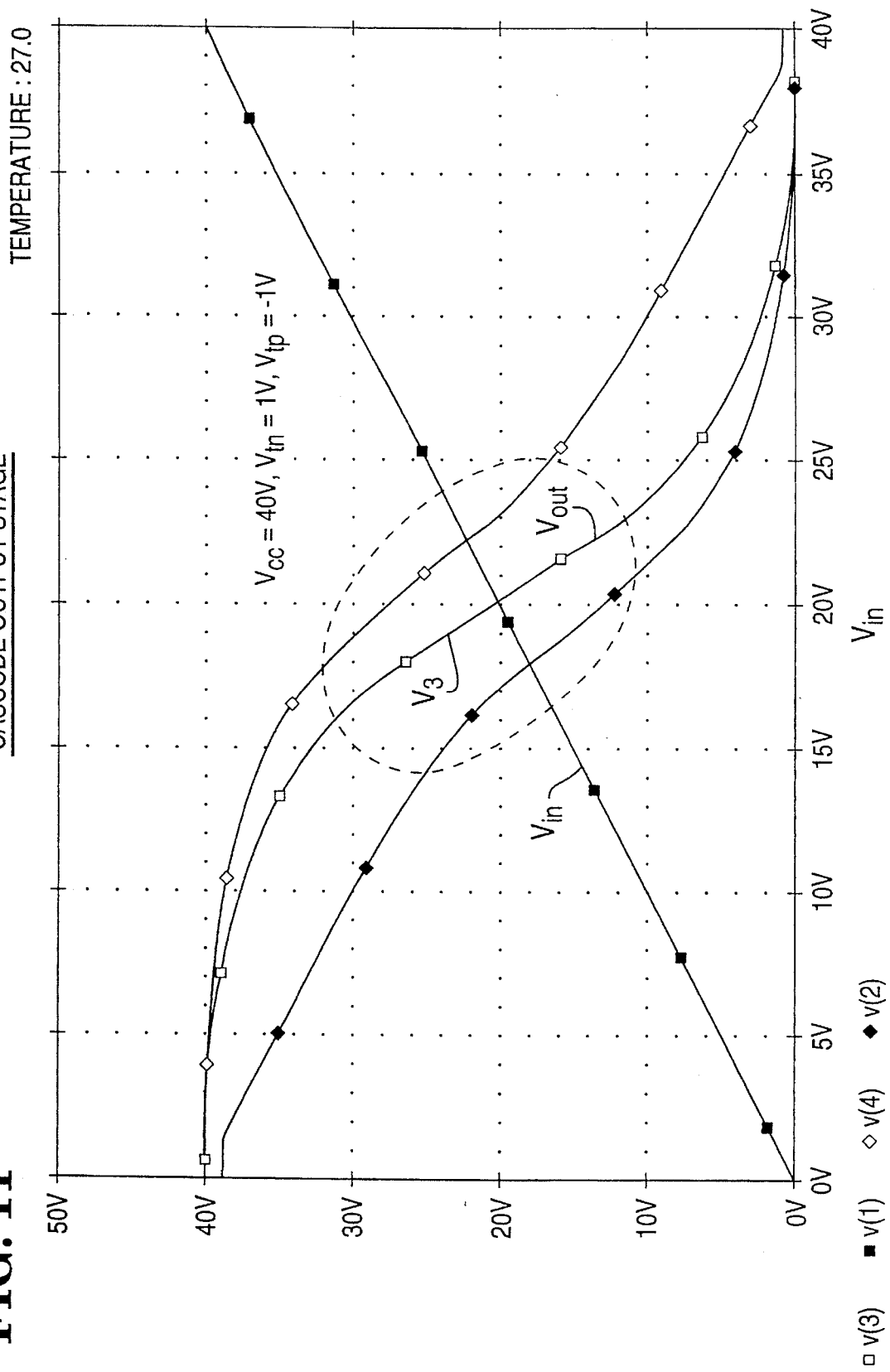
FIG. 11 is a plot of voltages obtained from a computer simulation of FIG. 10.

Amplifiers A1 and A2 form a cascode invertor. FIG. 11 illustrates a voltage transfer characteristic of this invertor, using idealized MOSFETs, and obtained by a simulation using the commercially available SPICE computer program. The voltage plots in FIG. 11 each correspond to a like-numbered node in FIG. 9.

As FIG. 11 indicates, Vcc equals 40 volts, Vtn (i.e., the threshold voltage of the n-channel MOSFETs) equals one volt, and Vtp (i.e., the threshold voltage of the p-channel MOSFETs) equals negative one volt.

A significant feature of FIG. 11 is that the output voltage, V(3), is linear over only a small part of its range, namely, that within the dashed circle.

Cascode in Feedback Path

Figure 12:
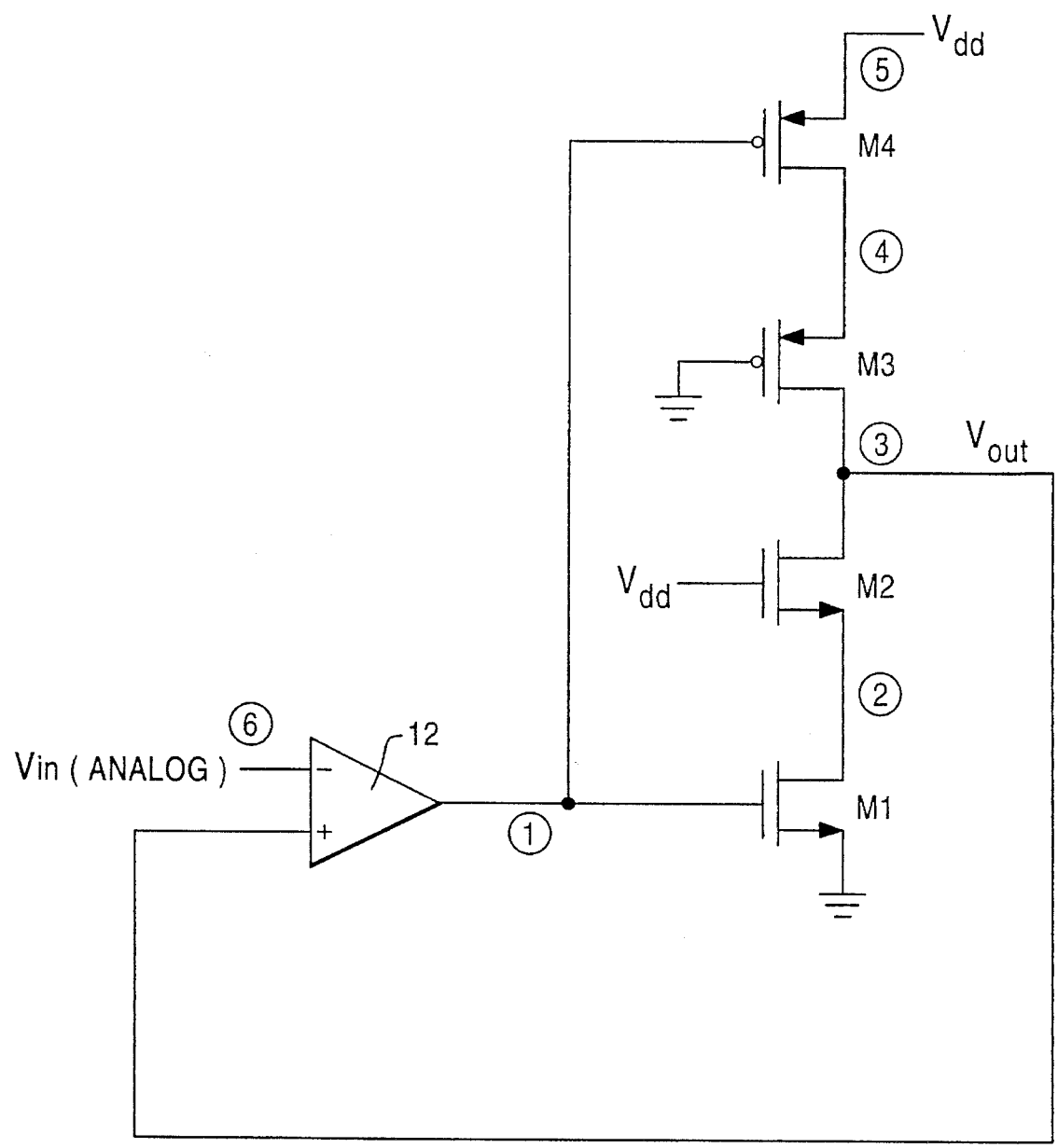
FIG. 12 illustrates one form of the invention.
Figure 13:
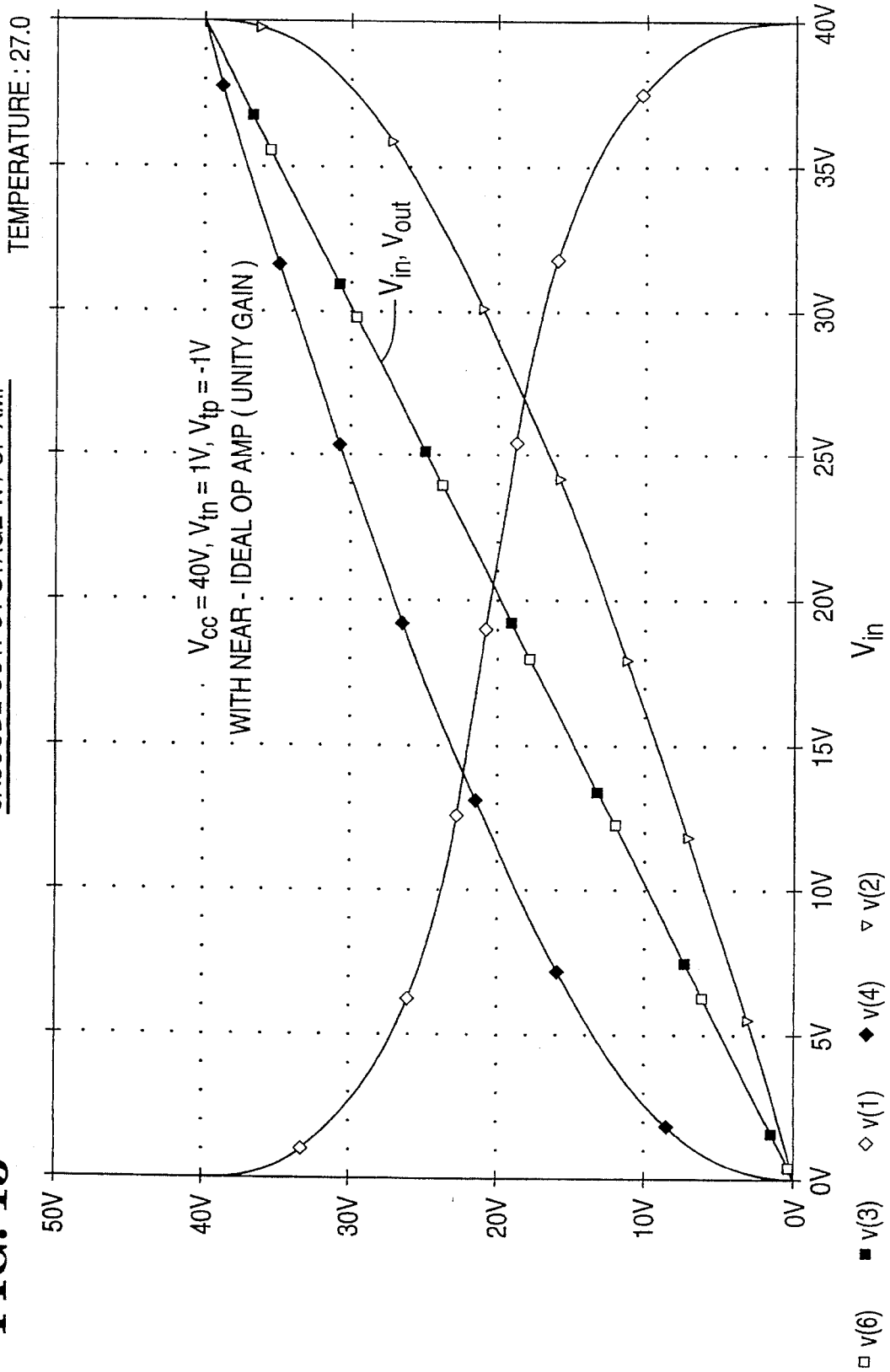
FIG. 13 is a plot of voltages obtained from a computer simulation of FIG. 12.

The present invention connects the cascode invertor of FIG. 10 into the feedback path of an operational amplifier 12, as shown in FIG. 12. Operational amplifiers, fabricated on integrated circuits, are known in the art. They are also called differential amplifiers. FIG. 13 illustrates output from a computer simulation of this circuit, using the same assumptions as in FIG. 11.

A significant feature of FIG. 13 is that the output (indicated by solid squares) directly tracks the input (indicated by hollow squares). Thus, the circuit of FIG. 12 linearizes the output, and the gain (ratio of output voltage to input voltage) is a constant, with a value of unity. The circuit of FIG. 12 is a voltage follower.

Implementation Using Gate-Isolated Transistors

The invention of FIG. 12 can be implemented using gate-isolated transistors. Such transistors are discussed in U.S. Pat. No. 4,975,758, issued Dec. 4, 1990, to the inventor herein. This patent is hereby incorporated by reference.

Figure 14:
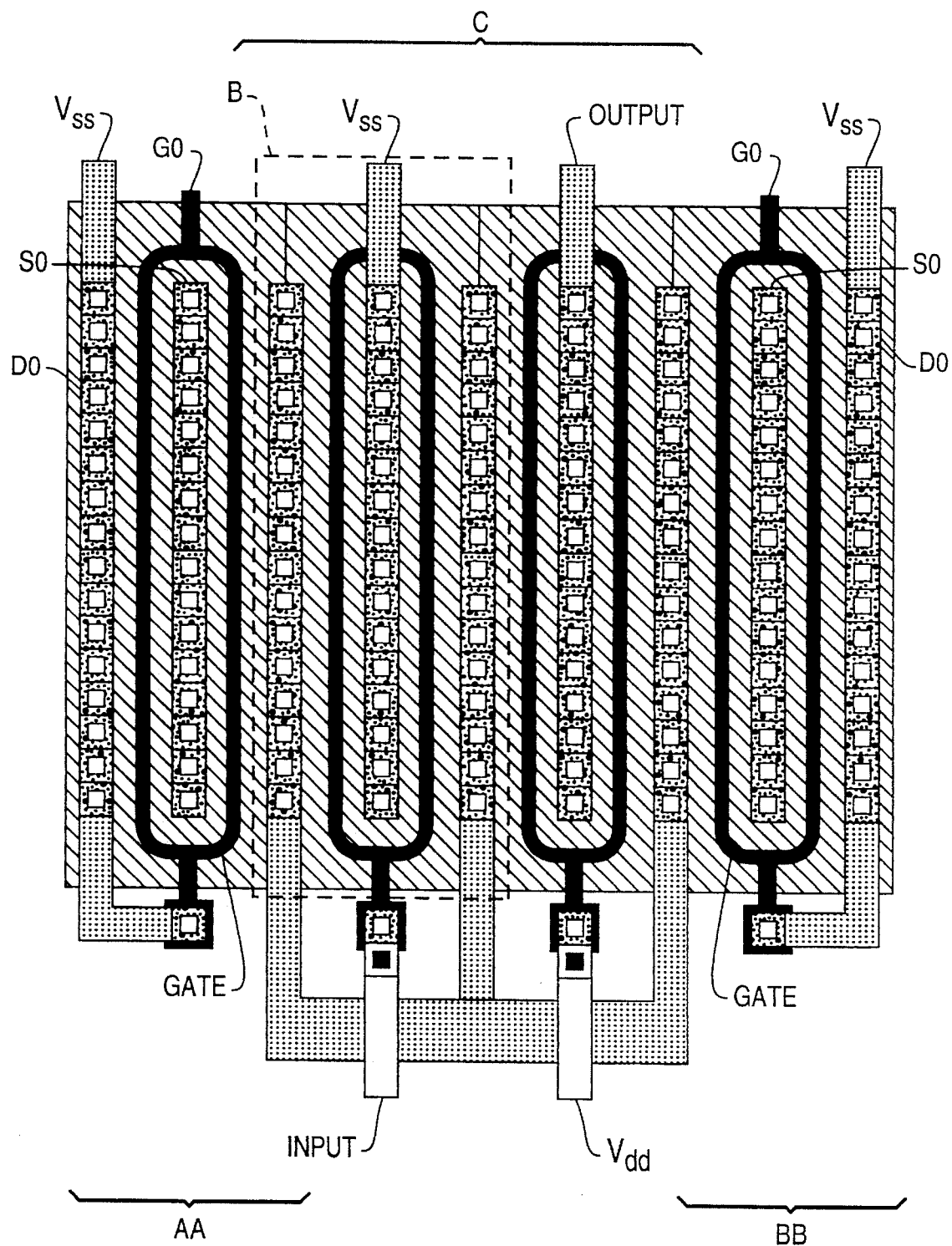
FIG. 14 illustrates gate isolation on an integrated circuit.
Figure 15:
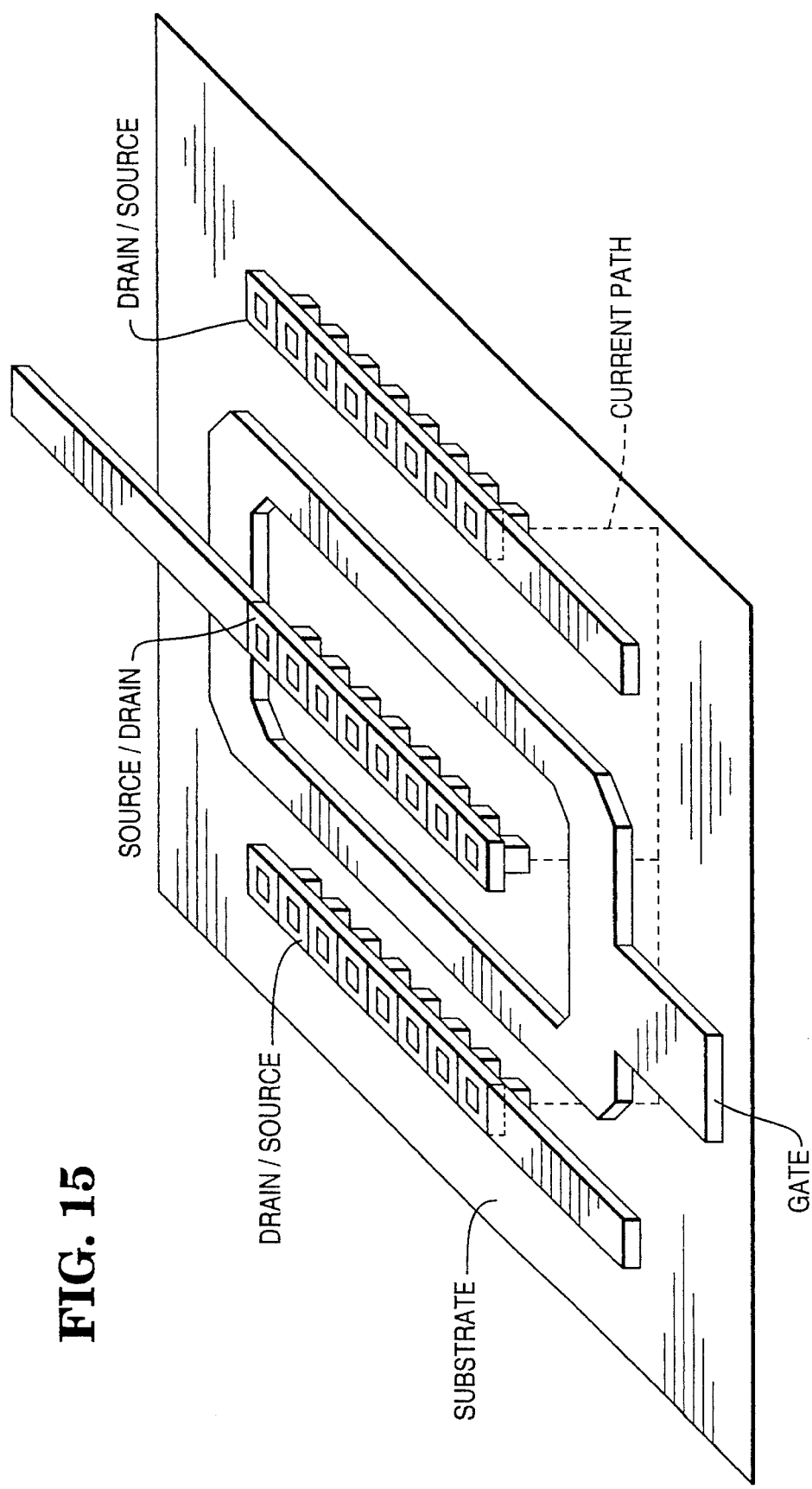
FIG. 15 is an exploded perspective view of part of FIG. 14.

A gate-isolated structure is illustrated in FIG. 14. FIG. 15 is a three-dimensional representation of the structure contained within the dashed box B in FIG. 14. For simplicity, insulating layers are not shown in FIG. 15. In FIG. 15, current flows along the dashed paths, as indicated, and is modulated by the electric field produced by the GATE.

As to gate isolation, in FIG. 14, the gate G0 is held at a voltage such that no channel exists between source S0 and drain D0. The channel is cut off. Thus, the regions AA and BB act as electrical isolation for the central region C.

The term "gate isolated" refers to the fact that the gate G in FIG. 14 prevents conduction from point C to point D. (Another type of isolation is "junction isolation," wherein a reverse-biased p-n junction acts as the isolation.)

Correspondence Between FIG. 14 and Cascode Invertor

Figure 16:
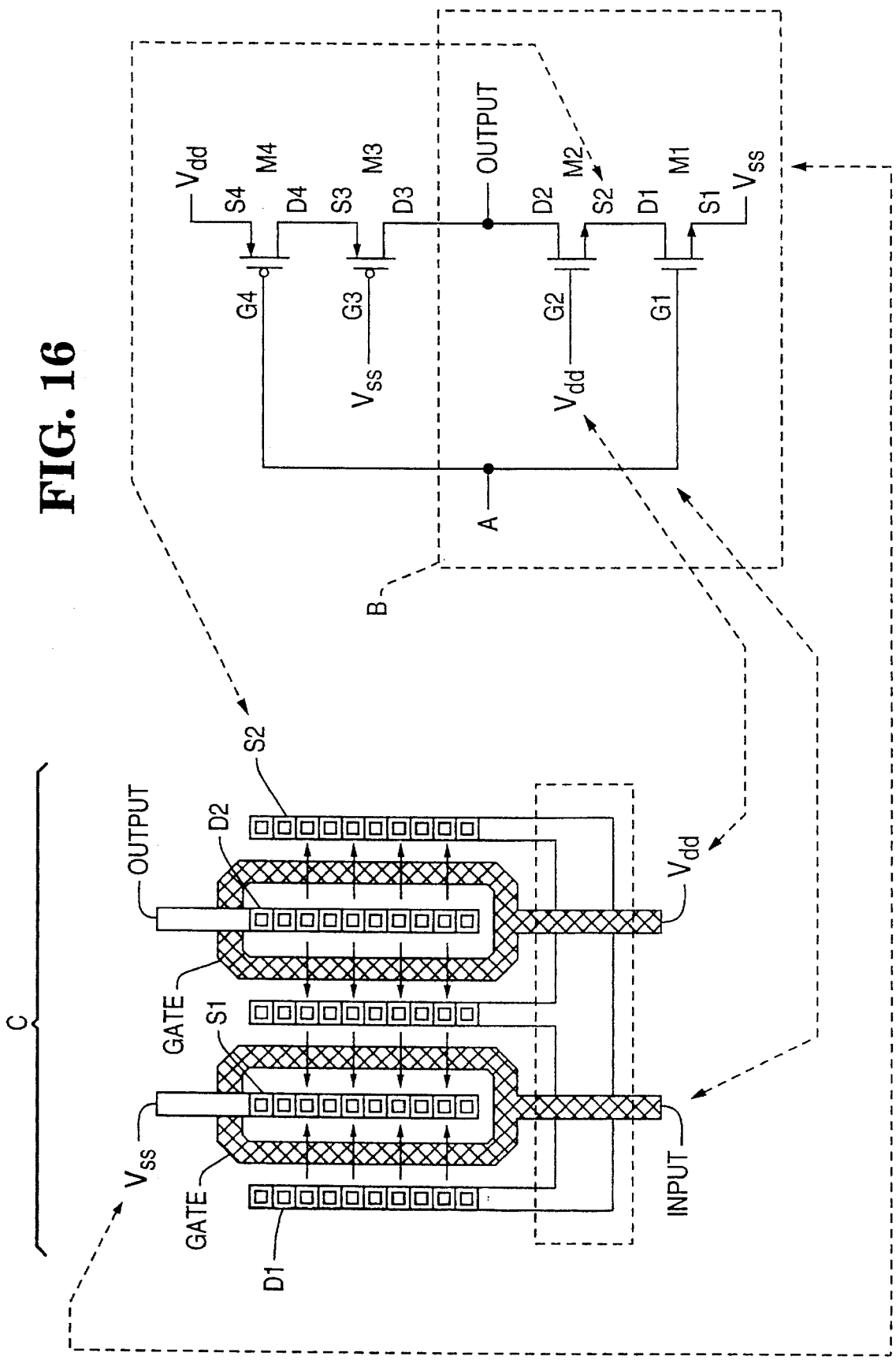
FIG. 16 illustrates how individual parts of FIG. 14 correspond to individual parts of FIG. 10.

The central region C of FIG. 14 is shown in FIG. 16, together with the circuit schematic of the cascode invertor of FIG. 10. The construction of the part of the circuit schematic contained within the dashed box B1 is illustrated by the central region C. That is, region C illustrates the layout of the two n-channel MOSFETs M1 and M2.

Dashed arrows extend between some corresponding structures in the circuit schematic and the central region C, such as Vdd and S2. However, not all corresponding structures are connected by dashed arrows, in order to avoid visual clutter. Nevertheless, the same identifying symbols (eg, "S1" or "D1") designate corresponding structures.

Figure 17:
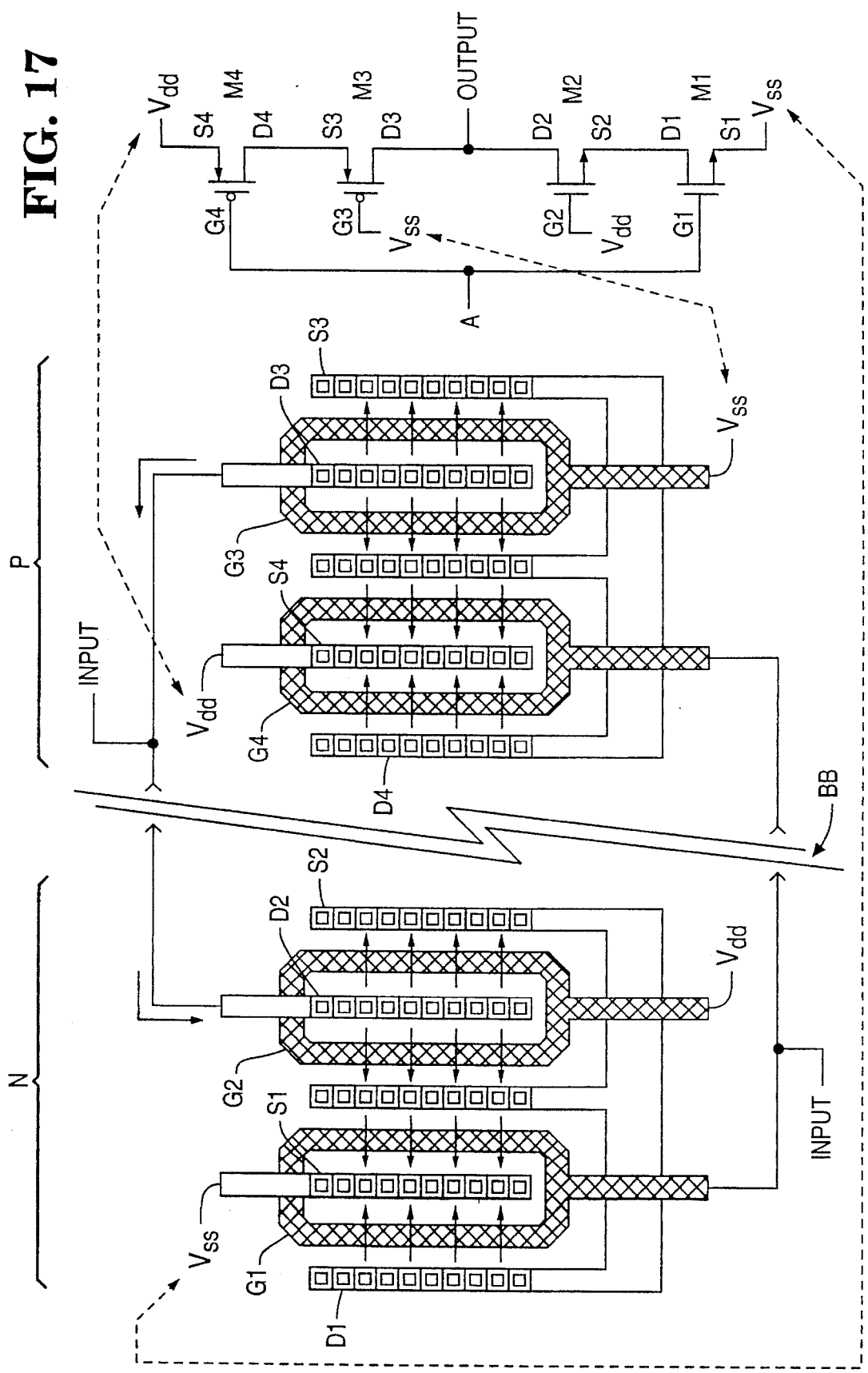
FIG. 17 illustrates, in greater detail, how individual parts of a sketch of the type in FIG. 14 correspond to individual parts of FIG. 10.

FIG. 17 adds the layout for the two p-channel MOSFETs M3 and M4. The break BB indicates the fact that the layout part labeled N resides on a different part of the substrate than the part labeled P: n-channel MOSFETs require a different substrate doping than do p-channel MOSFETs.

Figure 18:
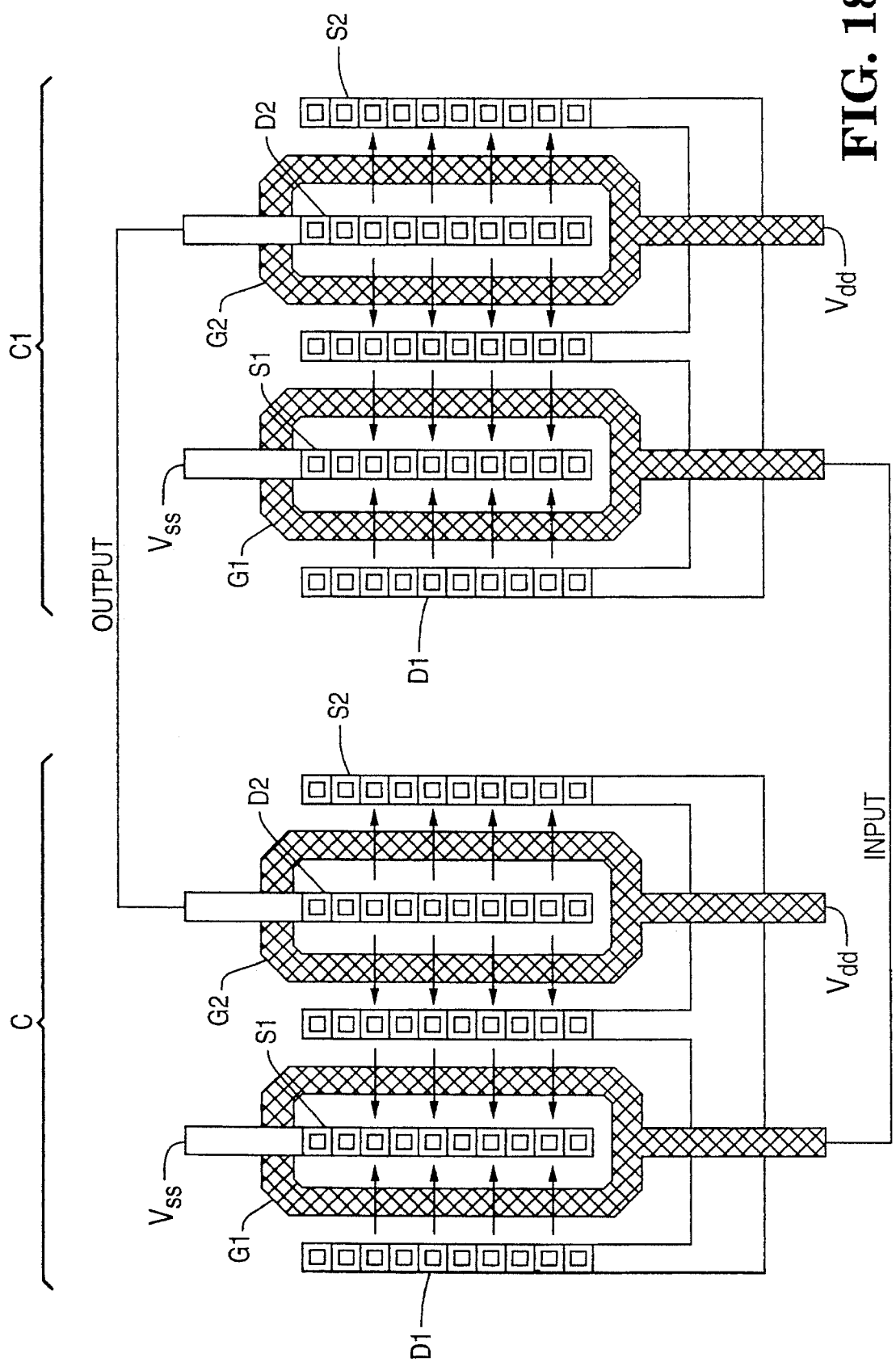
FIG. 18 illustrates parallel connection of the devices of the type shown in FIG. 16.

If a larger current-handling capability for the cascode invertor is required, the pair M1 and M2, and the pair M3 and M4, can be constructed as shown in FIG. 18. In FIG. 18, two regions C and C1, of the type C in FIG. 16, are constructed in parallel, thus, in effect, doubling the channel width of the MOSFETs. More than two units of the type shown in FIG. 18 can be placed in parallel, in order to provide still further current capacity.

Regions C and C1 must be isolated from each other. The isolation can be achieved using the gate isolation techniques illustrated in FIG. 14.

Significant Features

Figure 19:
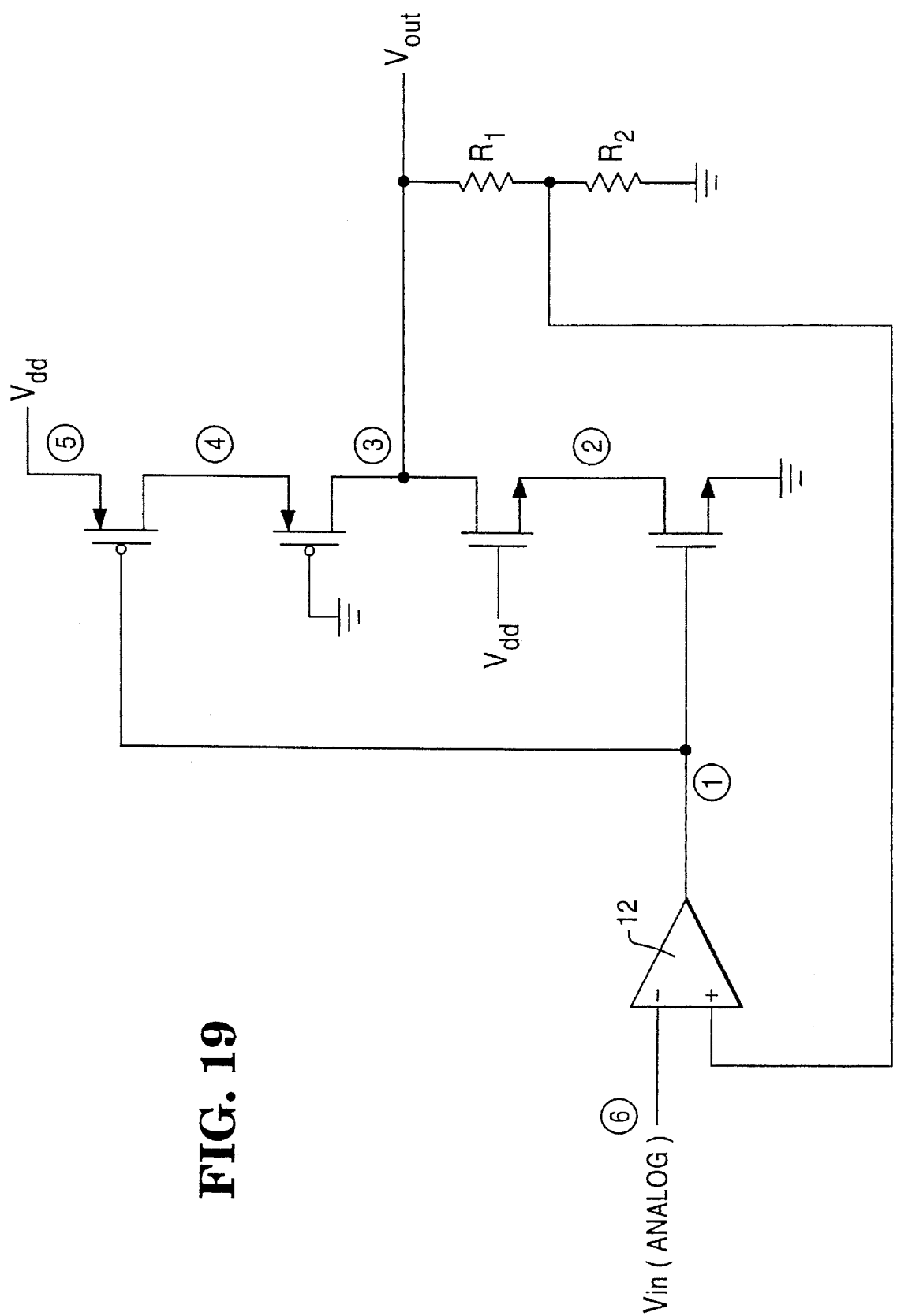
FIG. 19 illustrates another form of the invention.
Figure 20:
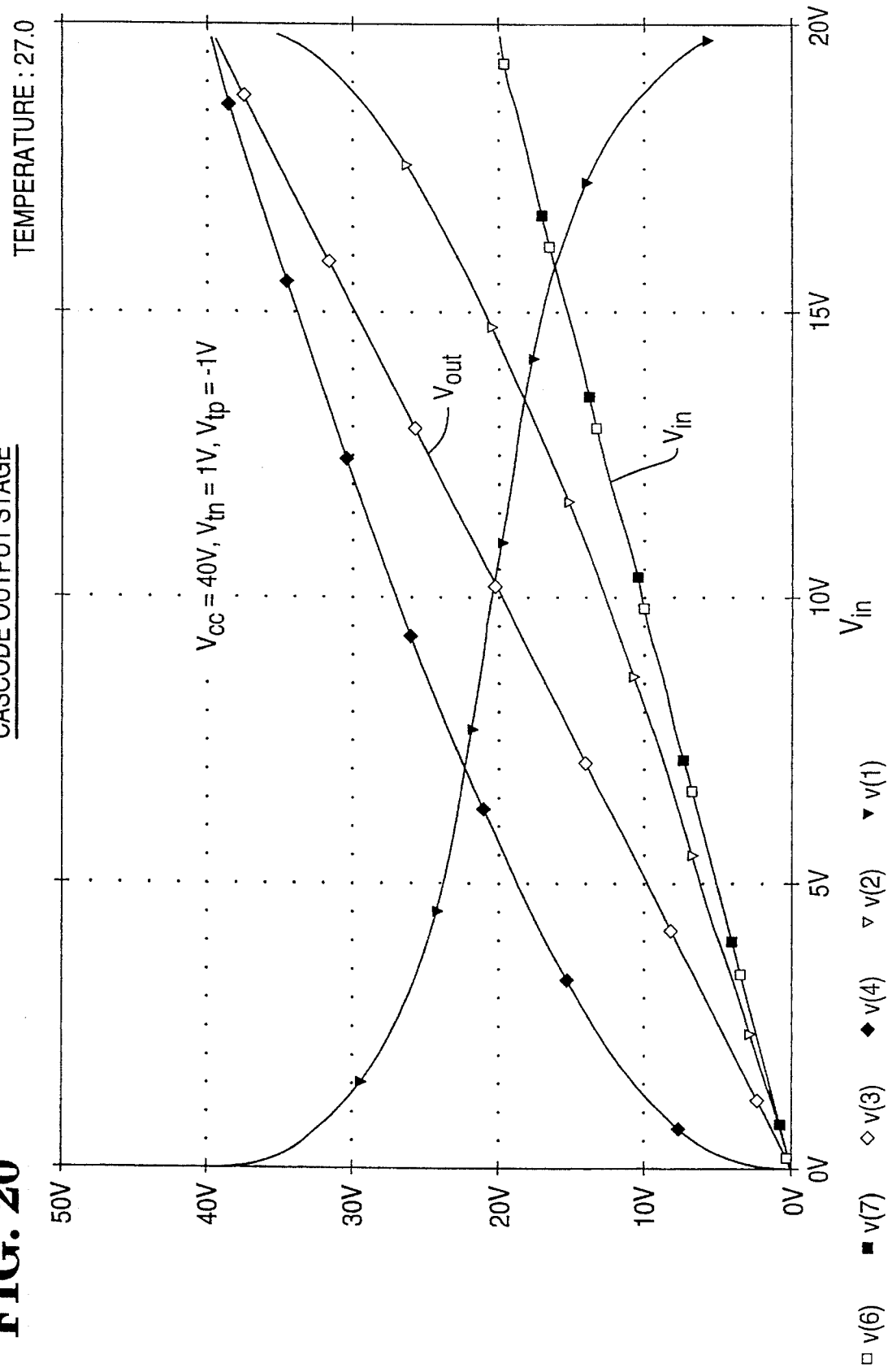
FIG. 20 is a plot of voltages obtained from a computer simulation of FIG. 19.

1. It was stated above that the circuit of FIG. 12 has (positive) unity gain. The gain can be adjusted, by placing a voltage divider into the feedback path, as shown in FIG. 19. Resistors R1 and R2 cause a fraction of the output voltage V(3) to be applied as feedback. FIG. 20 is an idealized computer simulation of the behavior of the circuit. The gain is two, because, in the example, R1=R2.

2. The MOSFETs M1, M2, M3, and M4 in FIG. 12 are all contained in a gate array. These transistors are of the digital type. Similarly, the transistors of which the operational amplifier 12 in FIG. 12 is constructed are also of the digital type, contained within a gate array.

The use of transistors contained within a gate array allows the device of FIG. 12 to be implemented without significant additional fabrication steps. Further, the device of FIG. 12 allows an analog amplifier to be fabricated on an integrated circuit otherwise devoted to digital devices.

3. As the US patent identified above indicates, the structure shown in FIG. 14 herein is one of a multiplicity of such structures (or cells), which form a ring, or frame, around the periphery of an interior field of an integrated circuit. The invention is fabricated using these peripheral cells. These cells are ordinarily used for constructing digital transistors, yet the driver of FIG. 12, constructed from these digital transistors, can be used to amplify analog signals.

4. The transconductances of the n-channel MOSFETs M1 and M2 and the p-channel MOSFETs M3 and M4 in FIG. 17 should be equal. Since the mobility of holes in silicon is about one-third that of electrons, the channel cross-section of the p-channel device should be about three times that of the n-channel devices, in order to attain these equal transconductances. If the channel thickness of the p-channel device is equal to that of the n-channel device, then the width of the former should be about three times the width of the latter.

5. In gate arrays generally, there can be significant numbers of unused transistors. For example, considering a die containing 50,000 initial transistors, about one-third can be used for gate isolation. (Gate isolation was discussed in connection with FIG. 14.) About another one-third can be unusable because the space above them is used for wiring between other transistors.

About one-third remains (or, more generally, from about 25 to about 40 percent remains) available for building the device of interest. Thus, more than one-half of the theoretically available transistors within the gate array are not used to construct the device.

From another point of view, in practice, it is common to find that the maximum utilization of transistors expected is about 40 percent of the theoretical maximum, and the minimum utilization is in the range of 5 to 10 percent. The actual utilizations lie within this range. For example, utilizations of 10, 15, 20, 25, 30, 35, and 40 percent are found in practice.

Figure 21:
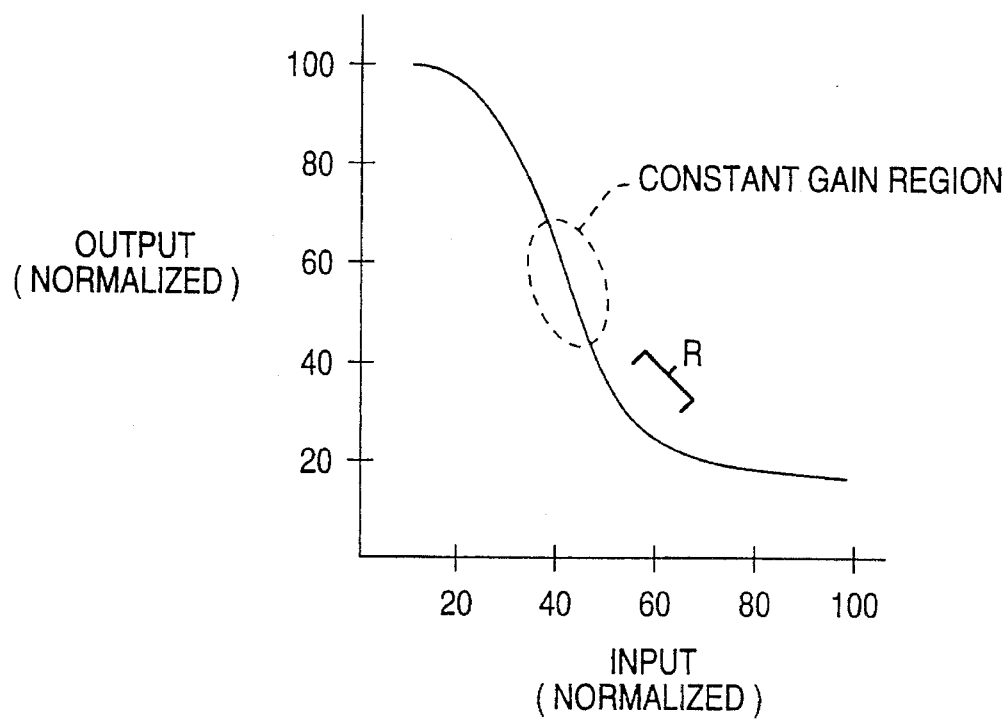
FIG. 21 illustrates a non-constant voltage gain plot.

6. Nearly every electronic device having an input and output has a constant gain over some region. For example, FIG. 21 illustrates the voltage transfer function for a hypothetical digital invertor. The gain (i.e., output/input) is constant (i.e., linear) over the range indicated. The gain is different over another range R. The fact that gain is constant over some small region does not qualify the device as "constant gain" type.

Figure 22:
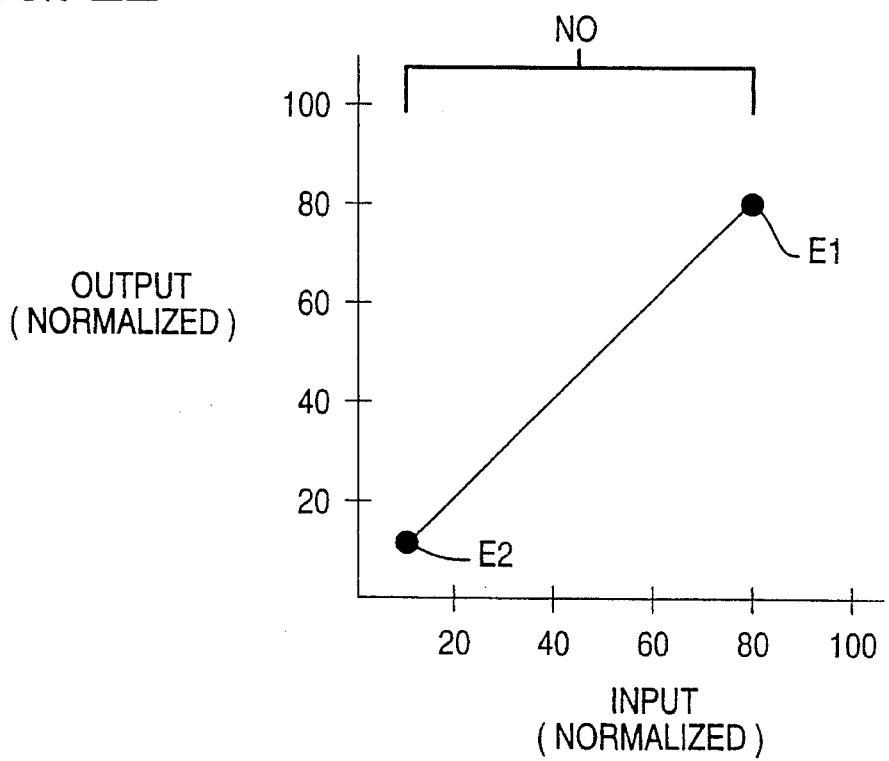
FIG. 22 illustrates a constant voltage gain plot.

The invention does provide a constant gain. In the idealized FIG. 13, the gain is absolutely constant. In a more practical case, represented by FIG. 22, the gain is not constant over the entire output voltage swing, but is constant over the normal operating range NO. That is, even though the gain changes at the extremes E1 and E2, these extremes are outside the normal operating range of the output signal. The normal operating range NO is determined by the characteristics of the op-amp shown in FIG. 12. One definition of normal operating range is that the output voltage range represented in E1 and E2 each cover about 20 to 80 percent of the output voltage swing. That is, point E1 represents an output signal which is about 80 percent of MAXIMUM. "MAXIMUM" is indicated on the FIG. 22. Point E2 indicates an output signal which is about 20 percent of MAXIMUM. Thus, the invention provides a constant gain when the output signal lies between about 20 percent of MAXIMUM and about 80 percent of MAXIMUM.

Numerous substitutions and modifications can be undertaken without departing from the true spirit and scope of the invention. What is desired to be secured by Letters Patent is the Invention as defined in the following claims.

I claim:

1. An integrated circuit device, comprising:
   a gate array including a plurality of transistors; and
   an analog amplifier constructed from gate array transistors, said analog amplifier having substantially linear gain when its output signal lies between about 20 and about 80 percent of maximum output signal.

2. In a gate array comprising gate array transistors, the improvement comprising:
   an input line carrying an input signal from a portion of the gate array;
   a differential amplifier constructed from at least some of the gate array transistors; and
   an output stage, driven by the differential amplifier, which passes the input signal with a gain of unity.

3. An integrated circuit device, comprising:
   a gate array comprising a plurality of transistors; and
   an output driver, which is constructed from transistors contained within the gate array, said output driver comprising means for receiving an input signal and means for amplifying the input signal to generate an output signal having a positive, substantially linear gain between about 20 and about 80 percent of maximum output signal.

4. An integrated circuit comprising:
   a) a gate array containing a plurality of field-effect transistors;
   b) an analog output driver, which is constructed from field-effect transistors contained within the gate array, comprising:
      i) an operational amplifier;
      ii) an invertor, comprising two cascode amplifiers in series, and driven by the operational amplifier; and
      iii) positive feedback between the output of the invertor and the operational amplifier.

5. In an integrated circuit comprising gate array transistors, the improvement comprising:
   a) an invertor comprising two cascode stages connected in series;
   b) a differential amplifier; and
   c) positive feedback between the output of the invertor and the differential amplifier, wherein said invertor and said differential amplifier are constructed from at least some of said gate array transistors.

6. An integrated circuit according to claim 5 and further comprising gate isolation which isolates the invertor.

7. An output driver for an integrated circuit, comprising:
   a) a first n-channel MOSFET (M1), having a gate (G1), a drain (D1), and a source (S1);
   b) a second n-channel MOSFET (M2), having a gate (G2), a drain (D2), and a source (S2);
   c) a first p-channel MOSFET (M3), having a gate (G3), a drain (D3), and a source (S3);
   d) a second p-channel MOSFET (M4), having a gate (G4), a drain (D4), and a source (S4), wherein said source (S4) of said second p-channel MOSFET (M4) is coupled to a high voltage, said gate (G2) of said second n-channel MOSFET (M2) is coupled to the high voltage, said gate (G1) of said first n-channel MOSFET (M1) is coupled to said gate (G4) of said second p-channel MOSFET (M4), said gate (G3) of said first p-channel MOSFET (M3) is coupled to a relatively lower voltage, said drain (D1) of said first n-channel MOSFET (M1) is coupled to said source (S2) of said second n-channel MOSFET (M2), said drain (D2) of said second n-channel MOSFET (M2) is coupled to said drain (D3) of said first p-channel MOSFET (M3), said source (S3) of said first p-channel MOSFET (M3) is coupled to said drain (D4) of said second p-channel MOSFET (M4);
   e) an operational amplifier having an inverting input, a non-inverting input, and an output; and
   f) means for feeding a signal to the inverting input, wherein said non-inverting input is coupled to said drain (D2) of said second n-channel MOSFET (M2) and said operational amplifier's output is coupled to said gate (G1) of said first n-channel MOSFET (M1).

8. An integrated-circuit according to claim 7 wherein the integrated circuit comprises gate array transistors.

* * * * *